United States Patent
Muraki et al.

(10) Patent No.: US 8,759,797 B2
(45) Date of Patent: Jun. 24, 2014

(54) DRAWING APPARATUS, DRAWING METHOD, AND METHOD OF MANUFACTURING ARTICLE

(71) Applicant: Canon Kabushiki Kaisha, Tokyo (JP)

(72) Inventors: Masato Muraki, Inagi (JP); Tomoyuki Morita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/835,471

(22) Filed: Mar. 15, 2013

(65) Prior Publication Data

US 2013/0264497 A1 Oct. 10, 2013

(30) Foreign Application Priority Data

Apr. 4, 2012 (JP) .................. 2012-085724

(51) Int. Cl.
G21K 5/10 (2006.01)
G03F 7/00 (2006.01)
H01J 37/317 (2006.01)

(52) U.S. Cl.
CPC .............. H01J 37/3174 (2013.01); G21K 5/10 (2013.01)
USPC .... 250/492.2; 250/397; 250/398; 250/492.22

(58) Field of Classification Search
USPC ........... 250/492.2, 492.22, 397, 398; 430/296
See application file for complete search history.

(56) References Cited

U.S. PATENT DOCUMENTS

| | | | | |
|---|---|---|---|---|
| 5,363,170 A | * | 11/1994 | Muraki | 355/67 |
| 5,393,987 A | * | 2/1995 | Abboud et al. | 250/492.22 |
| 5,528,048 A | * | 6/1996 | Oae et al. | 250/492.22 |
| 5,614,725 A | * | 3/1997 | Oae et al. | 250/492.22 |
| 5,635,976 A | * | 6/1997 | Thuren et al. | 347/253 |
| 5,876,902 A | * | 3/1999 | Veneklasen et al. | 430/296 |
| 5,977,548 A | * | 11/1999 | Oae et al. | 250/397 |
| 6,064,807 A | * | 5/2000 | Arai et al. | 430/30 |
| 6,069,684 A | * | 5/2000 | Golladay et al. | 355/53 |
| 6,118,129 A | * | 9/2000 | Oae et al. | 250/492.22 |
| 6,225,025 B1 | * | 5/2001 | Hoshino | 430/296 |
| 6,274,290 B1 | * | 8/2001 | Veneklasen et al. | 430/296 |
| 6,281,513 B1 | * | 8/2001 | Takenaka | 250/492.22 |
| 6,311,319 B1 | * | 10/2001 | Tu et al. | 716/53 |
| 6,319,642 B1 | * | 11/2001 | Hara et al. | 430/30 |
| 6,333,138 B1 | * | 12/2001 | Higashikawa et al. | 430/296 |

(Continued)

OTHER PUBLICATIONS

Hakkennes, E.A. "Demonstration of Real Time pattern correction for high throughput maskless lithography." Proceedings of SPIE—the International Society for Optical Engineering (journal), Mar. 2011, pp. 1-11, volume-issue No. 7970-1A, publisher: SPIE, Bellingham, Washington USA.

*Primary Examiner* — David A Vanore
(74) *Attorney, Agent, or Firm* — Canon USA, Inc., IP Division (57) ABSTRACT

A drawing apparatus performs drawing overlaid with a shot formed on a substrate with a plurality of charged particle beams based on a plurality of drawing stripe data that constitute drawing data. The apparatus includes a charged particle optical system configured to generate the plurality of charged particle beams; and a controller configured to generate a plurality of intermediate stripe data as data of a plurality of intermediate stripes, adjacent ones of the plurality of intermediate stripes overlapping with each other, to obtain information on distortion of the shot, and to transform the plurality of intermediate stripe data based on the information on the distortion to generate the plurality of drawing stripe data.

4 Claims, 10 Drawing Sheets

(56) References Cited

U.S. PATENT DOCUMENTS

| | | | |
|---|---|---|---|
| 6,455,211 B1 * | 9/2002 | Yui et al. | 430/22 |
| 6,483,120 B1 * | 11/2002 | Yui et al. | 250/491.1 |
| 6,486,479 B1 * | 11/2002 | Oae et al. | 250/492.2 |
| 6,515,409 B2 * | 2/2003 | Muraki et al. | 313/359.1 |
| 6,528,806 B1 * | 3/2003 | Kawamura | 250/492.22 |
| 6,566,662 B1 * | 5/2003 | Murakami et al. | 250/492.1 |
| 6,597,001 B1 * | 7/2003 | Yamashita et al. | 250/491.1 |
| 6,603,120 B2 * | 8/2003 | Yamashita | 250/307 |
| 6,642,532 B2 * | 11/2003 | Kamijo | 250/492.22 |
| 6,657,210 B1 * | 12/2003 | Muraki | 250/492.22 |
| 6,835,937 B1 * | 12/2004 | Muraki et al. | 250/396 R |
| 6,903,352 B2 * | 6/2005 | Muraki et al. | 250/492.22 |
| 7,005,658 B2 * | 2/2006 | Muraki | 250/492.22 |
| 7,095,022 B2 * | 8/2006 | Nakasuji et al. | 250/310 |
| 7,302,111 B2 * | 11/2007 | Olsson et al. | 382/266 |
| 7,615,746 B2 * | 11/2009 | Nagatomo et al. | 250/307 |
| 7,777,201 B2 * | 8/2010 | Fragner et al. | 250/491.1 |
| 7,888,642 B2 * | 2/2011 | Nakasuji et al. | 250/310 |
| 8,431,908 B2 * | 4/2013 | Inoue | 250/396 R |
| 8,466,440 B2 * | 6/2013 | Yashima et al. | 250/492.22 |
| 8,488,866 B2 * | 7/2013 | Terasawa et al. | 382/144 |
| 2003/0188289 A1 * | 10/2003 | Koyama | 716/19 |
| 2006/0214119 A1 * | 9/2006 | Katase et al. | 250/492.22 |
| 2012/0286173 A1 * | 11/2012 | Van De Peut et al. | 250/492.1 |
| 2013/0264497 A1 * | 10/2013 | Muraki et al. | 250/492.3 |

* cited by examiner

DRAWING APPARATUS, DRAWING METHOD, AND METHOD OF MANUFACTURING ARTICLE

BACKGROUND OF THE INVENTION

1. Field of the Invention

The present invention relates to a drawing apparatus that performs drawing overlaid with a shot formed on a substrate based on drawing stripe data that constitute drawing data.

2. Description of the Related Art

An electron beam drawing apparatus performs drawing by superimposition on shots on the substrate, so that coordinates of a plurality of shots (sample shots) on the substrate are measured. The measurement may be performed using an alignment mark formed for every shot. Further, based on an assumption that a coordinate of a design shot and a coordinate of an actual shot have a predetermined geometric conversion relationship, a parameter (coefficient) of the transformation may be determined by the measurement. In addition, the coordinate of the actual shot may be obtained based on the parameter and the coordinate of the design shot. Further, for example, if a coordinate (x, y) is measured for each of a plurality of marks at every shot, not only a position (for example, a coordinate of a center of each of the shots) of each of the shots but also a distortion (expansion and contraction or rotation) of each of the shots may be obtained.

Further, an electron beam drawing apparatus that performs drawing on a substrate based on drawing stripe data that configures drawing data is known (see Proc. of SPIE Vol. 7970 79701A-1 (2011)).

The distortion of the shot may occur during an exposure process to form the shot or other processes including a heating process.

Figure 10A:
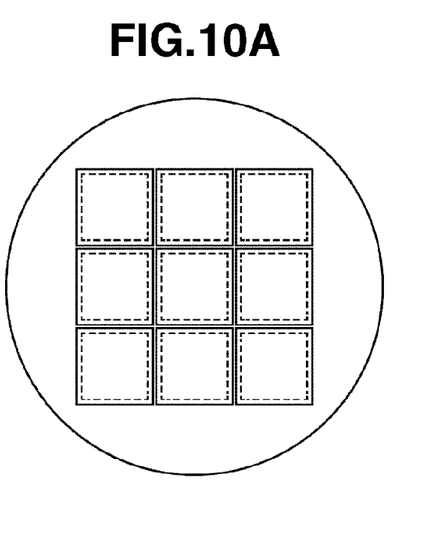
FIGS. 10A, 10B, 10C, and 10D are views describing an issue to be solved by the invention.

FIG. 10A is a view illustrating nine (3×3) shots on a wafer (substrate) when an expansion and contraction distortion is applied to the shots. A solid line indicates an actual shot and a broken line indicates a design shot (in this case, a center of the "actual" shot matches with a center of the "design" shot).

Figure 10B:
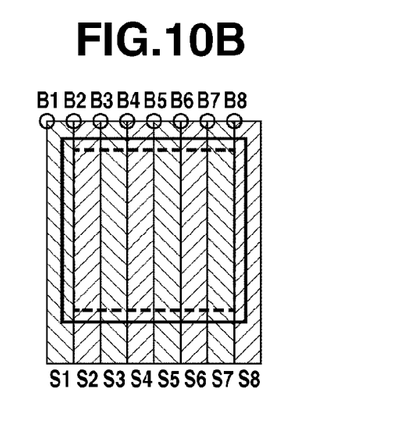

FIG. 10B illustrates an aspect when the expandable and contractable shot is drawn by a drawing apparatus discussed in Proc. of SPIE Vol. 7970 79701A-1 (2011). FIG. 10B illustrates initial positions B1 to B8 of the electron beam. The wafer moves upwardly while the electron beam scans the wafer left and right to draw a drawing area with a stripe shape (stripe drawing area) on the wafer. Stripe drawing areas S1 to S8 are drawn by electron beams.

Beam blanking is performed on each of the beams by control data according to the drawing data to draw the corresponding stripe drawing area. Control data of each of the beams may be generated by dividing drawing data of the shot in the unit of a stripe (drawing stripe data). Here, if the shot has an expansion and contraction distortion, even though the shot (design shot) represented by the broken line of FIG. 10B is drawn by the control data, an error may occur in the superimposition.

Figure 10C:
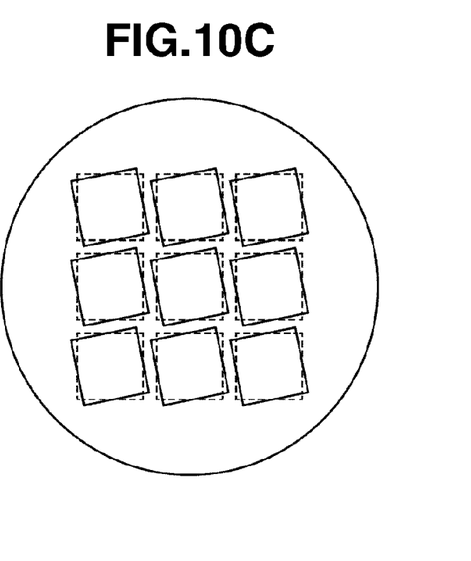
Figure 10D:
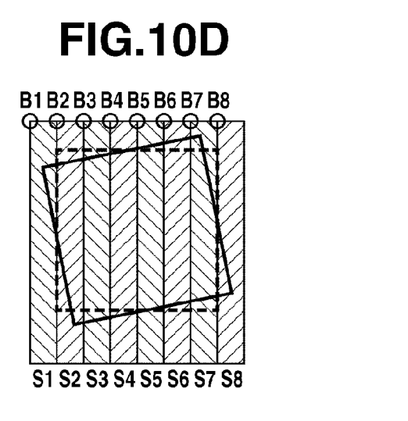

FIG. 10C is a view illustrating nine (3×3) shots on a wafer when the shots have a rotation distortion. In a case where the shot has the rotation distortion, an error occurs in the superimposition, which is illustrated in FIG. 10D. The usage of the solid line and the broken line is the same as in FIGS. 10A and 10B.

In order to reduce such an error, a method that distorts the drawing data based on the distortion of the measured shot and then divides the drawing data in the unit of a stripe to generate control data for every beam is considered. However, this method is inappropriate because this method requires enormous processing time.

SUMMARY OF THE INVENTION

The present invention is directed to a drawing apparatus advantageous for generating drawing stripe data in terms of both overlay precision and throughput.

According to an aspect of the present invention, a drawing apparatus is configured to perform drawing overlaid with a shot formed on a substrate with a plurality of charged particle beams based on a plurality of drawing stripe data that constitute drawing data. The apparatus includes a charged particle optical system configured to generate the plurality of charged particle beams; and a controller configured to generate a plurality of intermediate stripe data as data of a plurality of intermediate stripes, adjacent ones of the plurality of intermediate stripes overlapping with each other, to obtain information on distortion of the shot, and to transform the plurality of intermediate stripe data based on the information on the distortion to generate the plurality of drawing stripe data.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

Through entire drawings to describe exemplary embodiments, in principle, same components are denoted by the same reference numerals and repeated description of thereof will be omitted.

Figure 1:
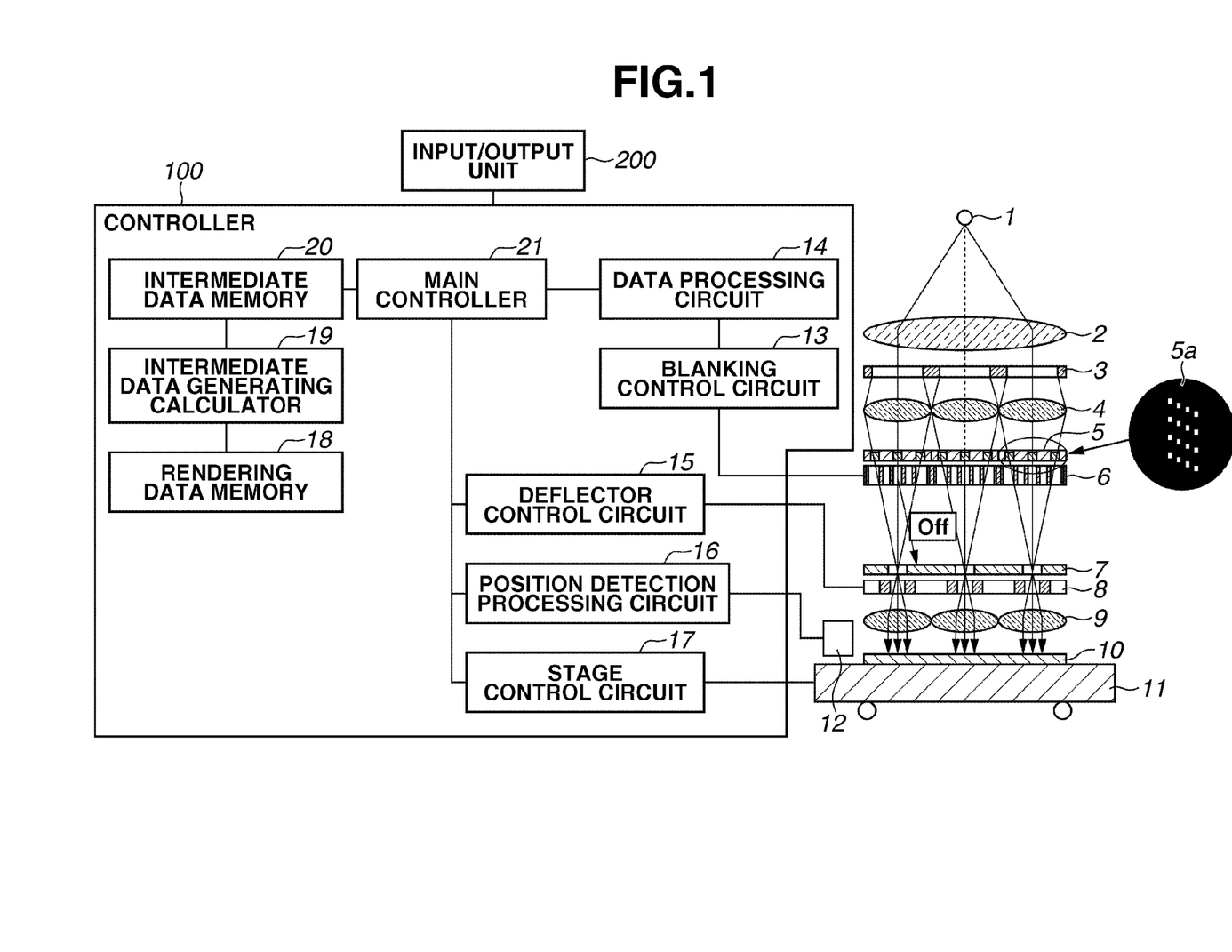
FIG. 1 is a view illustrating a configuration of a drawing apparatus.

A first exemplary embodiment will be described. FIG. 1 is a view illustrating a configuration of a drawing apparatus. In FIG. 1, a thermal electron type electron source including LaB6 or BaO/W (dispenser cathode) may be employed as an electronic emission material in an electronic source 1. A collimator lens 2 is an electrostatic type lens which converges an electron beam using an electric field. The electron beam which is radiated from the electron source 1 becomes a substantially parallel electron beam by the collimator lens 2. Further, a drawing apparatus according to the first exemplary embodiment and a second exemplary embodiment performs drawing on the substrate using a plurality of electron beams. However, a charged particle beam such as an ionic line other than the electron beam may be used and the drawing apparatus may be generalized as a drawing apparatus that performs drawing on the substrate using a plurality of charged particle beams.

An aperture array member 3 has openings which are two-dimensionally arranged. A condenser lens array 4 is configured with two-dimensionally arranged electrostatic condenser lenses each having the same optical power. A pattern aperture array (aperture array member) 5 includes arrays (sub arrays) each having a pattern aperture, which defines (determines) a shape of the electron beam, to correspond to the respective condenser lenses. A shape 5a illustrates a shape of the sub array viewed from the above.

The substantially parallel electron beam from the collimator lens 2 is divided into a plurality of electron beams by the aperture array 3. The divided electron beam irradiates a corresponding sub array of the pattern aperture array 5 through a corresponding condenser lens of the condenser lens array 4. Here, the aperture array 3 has a function that defines a range of the irradiation.

A blanker array 6 is configured by arranging individually drivable electrostatic blankers (electrode pair) to correspond to the electron beams. A blanking aperture array 7 is configured by arranging a plurality of blanking apertures (one aperture) to correspond to each of the condenser lenses. A deflector array 8 is configured by arranging deflectors which deflect the electron beam in a predetermined direction to correspond to each of the condenser lenses. An objective lens array 9 is configured by arranging electrostatic objective lenses to correspond to each of the condenser lenses. A wafer (substrate) 10 is subjected to drawing (exposure). In the configuration example of the exemplary embodiment, an electron optical system (charged particle optical system) which generates a plurality of electron beams (charged particle beams) to perform drawing on the substrate is configured with components denoted by reference numerals 1 to 9.

The electron beam from each of the sub arrays of the pattern aperture array 5 which is irradiated by the electron beam is reduced approximately to one-hundredth of its original size through corresponding blanker, blanking aperture, deflector, and objective lens to be projected onto the wafer 10. Here, surfaces of the sub arrays on which the pattern apertures are arranged become object surfaces and top surfaces of the wafers 10 are arranged on image surfaces corresponding to the object surfaces.

Further, each of the electron beams from the sub arrays of the pattern aperture array 5 irradiated by the electron beam is switched according to the control of the corresponding blanker whether to pass through the blanking apertures array 7, that is, whether the electron beam is incident onto the wafer. In parallel thereto, the deflector array 8 causes the electron beams which are incident onto the wafer to collectively perform scanning on the wafer.

Further, the electron source 1 forms an image on the blanking aperture through the collimator lens 2 and the condenser lens and a size of the image is set to be larger than an aperture of the blanking aperture. Therefore, a semi-angle (half angle) of the electron beam on the wafer is defined by the aperture of the blanking aperture. Further, the aperture of the blanking aperture array 7 is arranged in a front side focal position of the corresponding objective lens, so that a principal ray of the plurality of electron beams from the plurality of pattern apertures of the sub array is substantially vertically incident onto the wafer. Therefore, even if the top surface of the wafer 10 is displaced vertically, the displacement of the electron beam is minute in the horizontal surface.

An X-Y stage (simply referred to as a stage) supports the wafer 10 and is movable in the X-Y plane (horizontal plane) which is perpendicular to an optical axis. The stage includes a chuck (not illustrated) that supports (attracts) the wafer 10 and a detector (not illustrated) that detects the electron beam including the aperture pattern to which the electron beam is incident. A mark detector 12 irradiates light having a wavelength, which is not sensed by a resist, onto an alignment mark formed on the wafer 10 and detects a reflection image of the mark using an imaging element.

A blanking control circuit 13 is a control circuit that individually controls a plurality of blankers which configures the blanker array 6. A data processing circuit 14 includes a buffer memory. The data processing circuit 14 is a processing unit that generates control data of the blanking control circuit. A deflector control circuit 15 is a control circuit that controls the plurality of deflectors which configures the deflector array 8 using a common signal. A position detection processing circuit 16 is a processing circuit that finds a position of the mark based on the signal from the mark detector 12 and finds a distortion of the shot based on the position of the mark. A stage control circuit 17 is a control circuit that controls to determine a position of the stage 11 in cooperation with a laser interferometer (not illustrated) which measures the position of the stage.

A drawing data memory 18 stores drawing data for a shot. An intermediate data generating calculator 19 generates intermediate stripe data (intermediate data) from the drawing data to compensate the distortion of a shot. An intermediate data memory 20 stores the intermediate data.

A main controller 21 transmits the intermediate data to a buffer memory of the data processing circuit 14, and comprehensively control the drawing apparatus via the above-described circuits or the memories. Further, in the exemplary embodiment, the controller 100 of the drawing apparatus is configured with the components 13 to 21, which is only an example, but may be appropriately modified.

Figure 2:
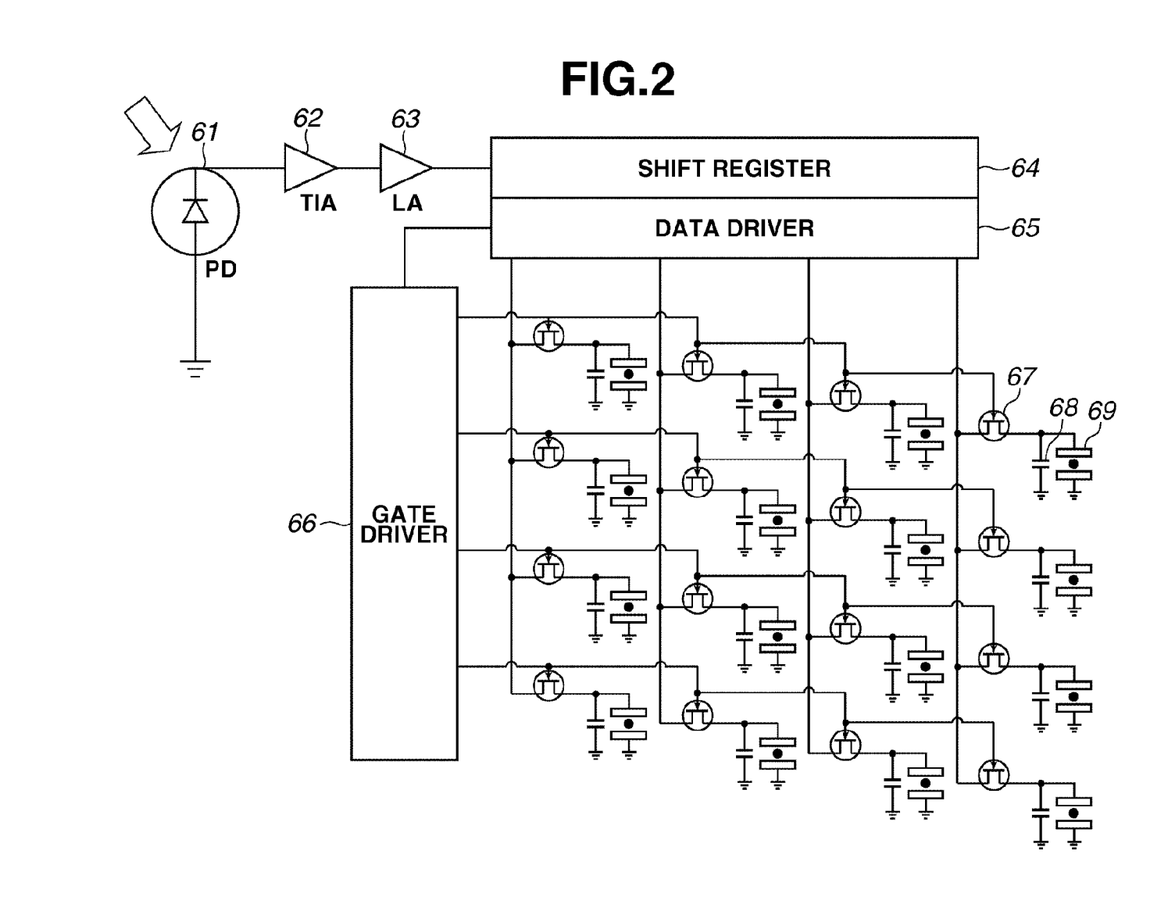
FIG. 2 is a view illustrating a configuration of a blanker array.

FIG. 2 is a view illustrating a configuration of the blanker array 6. A control signal from the blanking control circuit 13 is supplied to the blanker array 6 through an optical fiber for optical communication (not illustrated). Control signals of the plurality of blankers are transmitted to correspond to one sub array per fiber. An optical signal from the optical fiber for optical communication is received by a photo diode 61 and a current-voltage conversion is performed by a transfer impedance amplifier 62. Further, an amplitude of the optical signal is adjusted by a limiting amplifier 63. An amplitude adjusted signal is input to a shift register 64, so that a serial signal is converted into a parallel signal. At intersections of gate electrode lines which run in a horizontal direction and source electrode lines which run in a vertical direction, field effect transistors (FETs) 67 are arranged and two bus lines are respectively connected to a gate and a source of each of the FETs 67. A blanker electrode 69 and a capacitor 68 are connected to a drain of the FET 67 and a common electrode is connected to an opposite side of two capacitive elements.

When a voltage is applied to the gate electrode line, all FETs for one row connected thereto are turned on, so that a current flows between the source and the drain. In this case, each voltage applied to the source electrode line is applied to the blanker electrode 69 and a charge depending on the voltage is accumulated (charged) in the capacitor 68. When the charging for one row is completed, the gate electrode lines are switched so that the voltage is applied to next row and the FETs for the first one column lose the gate voltage to be turned off. Even though the blanker electrode 69 for the first one row loses the voltage from the source electrode line, the blanker electrode 69 can maintain a required voltage by the charges accumulated in the capacitor 68 until a voltage is applied to the gate electrode line next time. As described above, according to an active matrix driving method which uses the FET as a switch, the voltage is applied parallel to the plurality of FETs by the gate electrode lines, so that it is possible to cope with the plurality of blankers with a smaller number of wirings.

In an example of FIG. 2, the blankers are arranged in four rows and four columns. A parallel signal from the shift register 64 is applied to the source electrode of the FET as a voltage through a data driver 65 and the source electrode line. In cooperation with this, the FETs for one row are turned on by the voltage which is applied from a gate driver 66, so that the corresponding blankers for one row are controlled. Such an operation is sequentially repeated for every row, so that blankers arranged in four rows and four columns are controlled.

Figure 3:
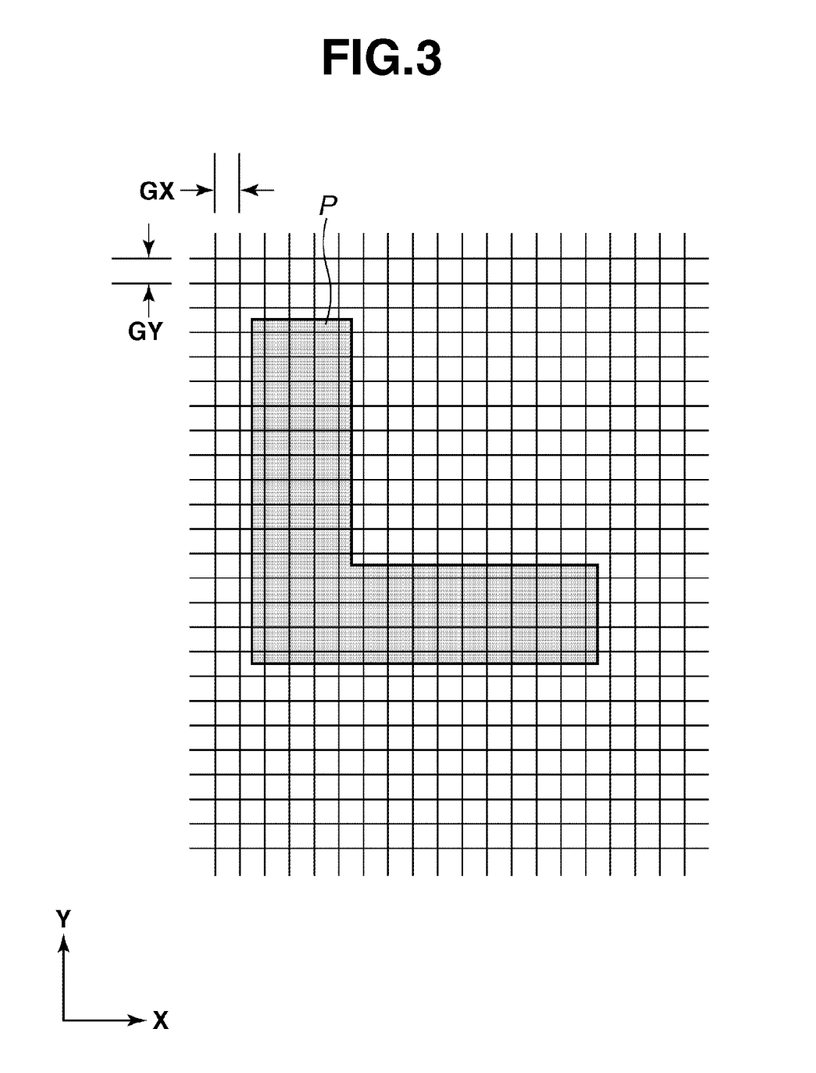
FIG. 3 is a view describing a raster scanning drawing method.

A raster scanning drawing method according to the exemplary embodiment will be described with reference to FIG. 3. While the electron beam is caused to perform scanning on scanning grids on the wafer 10 which is determined by the deflection by the deflector array 8 and a position of the stage 11, the blanker array 6 controls whether to irradiate the electron beam on the substrate according to a drawing pattern P. Here, the scanning grids are grids formed with a pitch GX (a first interval) in an X-direction and a pitch GY (a second interval) in a Y direction, as illustrated in FIG. 3. Irradiation or non-irradiation of the electron beam is assigned to intersections (grid points) of vertical lines and horizontal lines in the drawing.

Figure 4:
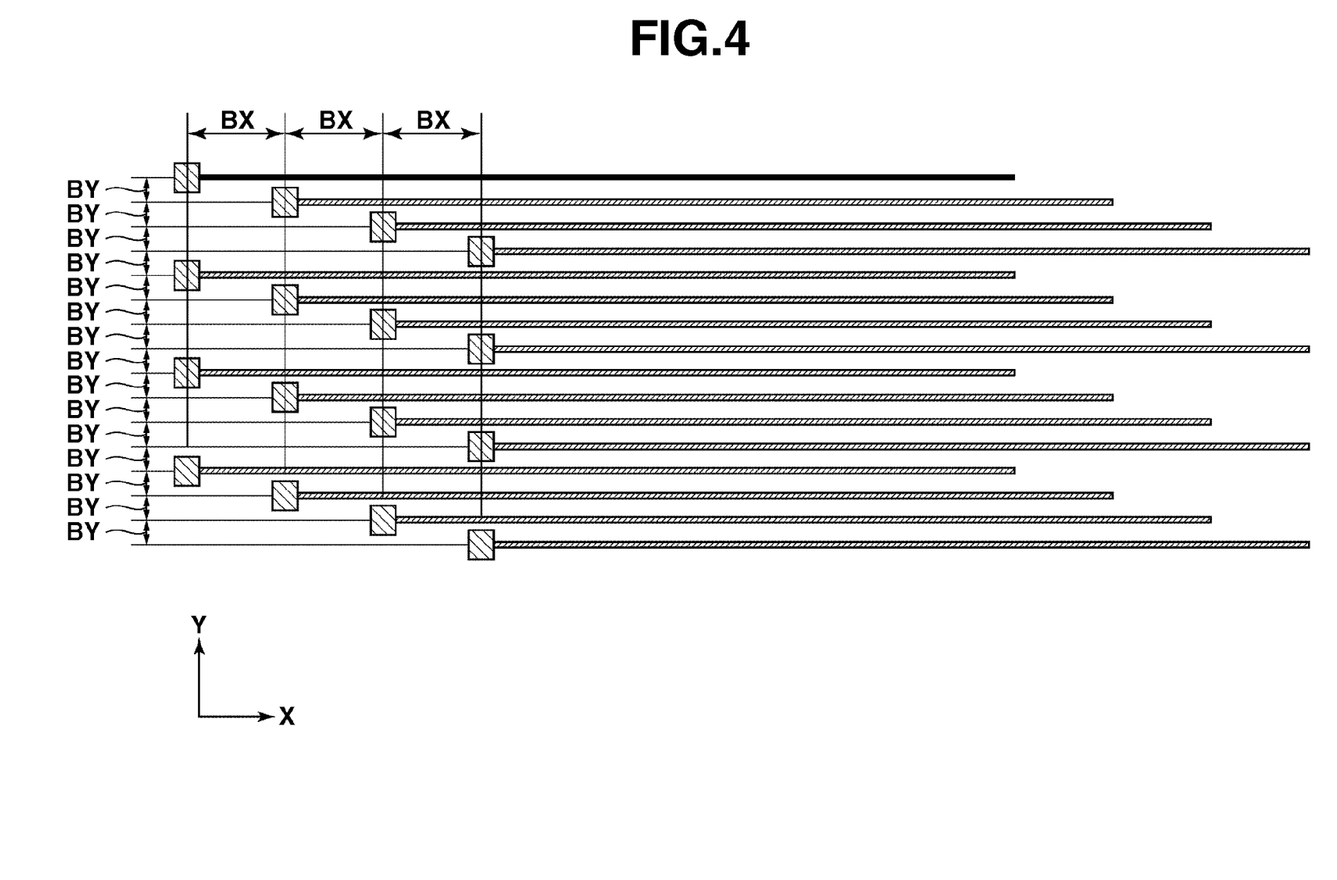
FIG. 4 is a view describing an arrangement and scanning of an electron beam sub array on a substrate.

FIG. 4 is a view describing an arrangement and scanning of an electron beam sub array on the wafer. As illustrated in FIG. 4, pattern apertures of the sub array are projected onto the wafer with a pitch BX in the X direction and a pitch BY in the Y direction. A size of each of the pattern apertures is PX in the X direction and PY in the Y direction on the wafer. If the pattern aperture is projected onto the wafer to be reduced to one-hundredth of the original size, an actual size thereof is one hundred times larger of a size on the wafer. An image (electron beam) of the pattern aperture is deflected in the X direction by the deflector array 8 and is caused to perform scanning on the wafer. In parallel thereto, the stage 11 is continuously moved (scanned) in the Y direction. Here, the electron beam is deflected in the Y direction by the deflector array 8 to cause the electron beams to rest in the Y direction on the wafer 10. Further, the deflector array 8 which deflects the charged particle beam, which is projected by a projection system, at least in the X direction (a first direction) and the stage 11 which is movable in the Y direction (a second direction perpendicular to the first direction) while supporting the substrate are included in a scanning unit. Here, the scanning unit is a unit that performs relative scanning between the plurality of charged particle beams and the substrate in the X direction and the Y direction.

Figure 5:
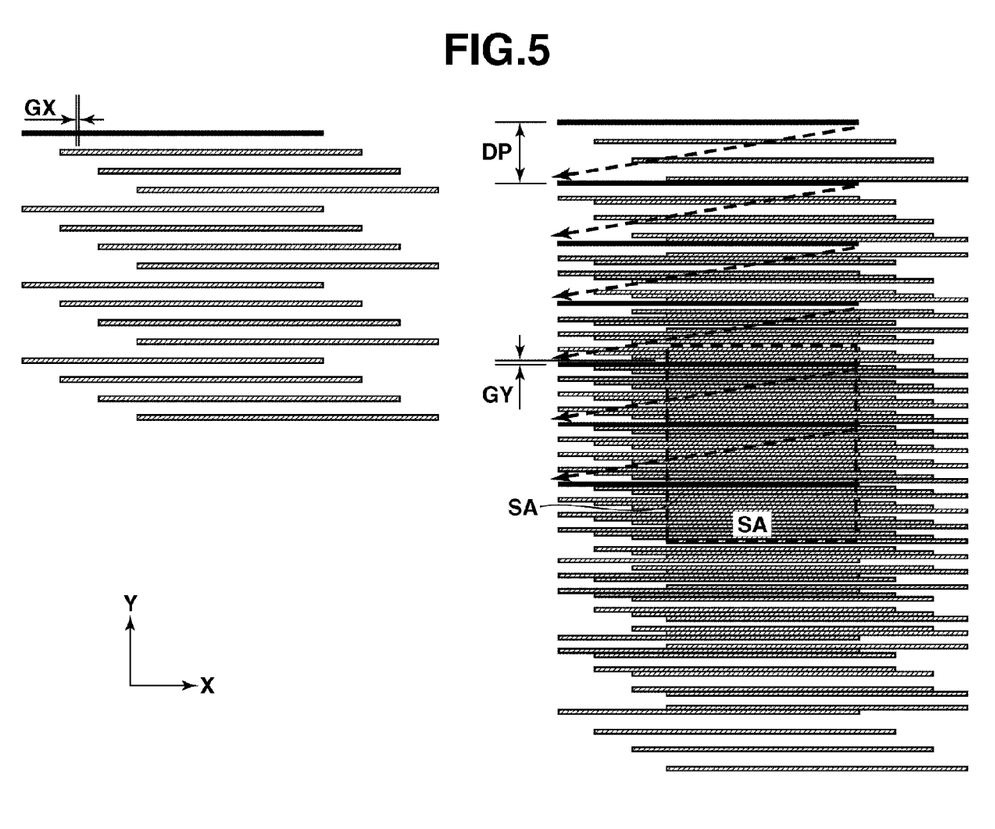
FIG. 5 is a view illustrating a scanning trajectory of the electron beam on the substrate.

FIG. 5 is a view illustrating a scanning trajectory of the electron beam on the wafer. A left part of FIG. 5 illustrates a scanning trajectory of each of the electron beams of the sub array in the X direction. Here, irradiation and non-irradiation of each of the electron beams is controlled for every grid point defined by the grid pitch GX. Here, for the simplification of the description, the trajectory of the electron beam at the top is indicated by solid black.

A right part of FIG. 5 illustrates a trajectory formed by sequentially and repeatedly performing scanning of each of the electron beams in the X direction through a fly back in a deflection width DP in the Y direction as indicated by an broken line arrow after performing scanning of each of the electron beams in the X direction. In the drawing, it is known that in a frame indicated by a thick broken line, a stripe drawing area SA with a stripe width SW is filled with a grid pitch GY. In other words, the stripe drawing area SA can be drawn by continuously moving the stage 11 at a constant speed. If the number of beams of the sub array is N*N, the condition therefor satisfies the following equations.

$$N2=K*L+1 \ (K \text{ and } L \text{ are natural numbers}) \quad (1)$$

$$BY=GY*K \quad (2)$$

$$DP=(K*L+1)*GY=N2*GY \quad (3)$$

According to this condition, if a beam interval BY in the Y direction is determined as represented in Equation (2) by K which satisfies Equation (1), a minute pattern may be drawn by miniaturization of the scanning grid interval GY without depending on the miniaturization of the aperture or blanker interval which has a limitation in a manufacturing aspect. Further, if the deflection width DP in the Y direction is determined as represented in Equation (3), any parts of the stripe drawing area SA which is below an origin point of a black arrow illustrated in FIG. 5 may be drawn at a grid pitch GY. Therefore, a minute pattern may be satisfactorily drawn by continuously moving (scanning) the stage in one direction.

In the exemplary embodiment, N=4, K=5, L=3, GX=GY=5 nm, BY=25 nm, DP=80 nm, SW=2 μm. Here, since the stripe width SW is necessarily smaller than the deflection width of each of the electron beams, it can satisfy a relationship of N*BY>BX if a pitch between the blankers is allowable in manufacturing. By doing this, a deflection area which is not used for drawing becomes smaller and it is advantageous in the view of a manufacturing capability.

Figure 6:
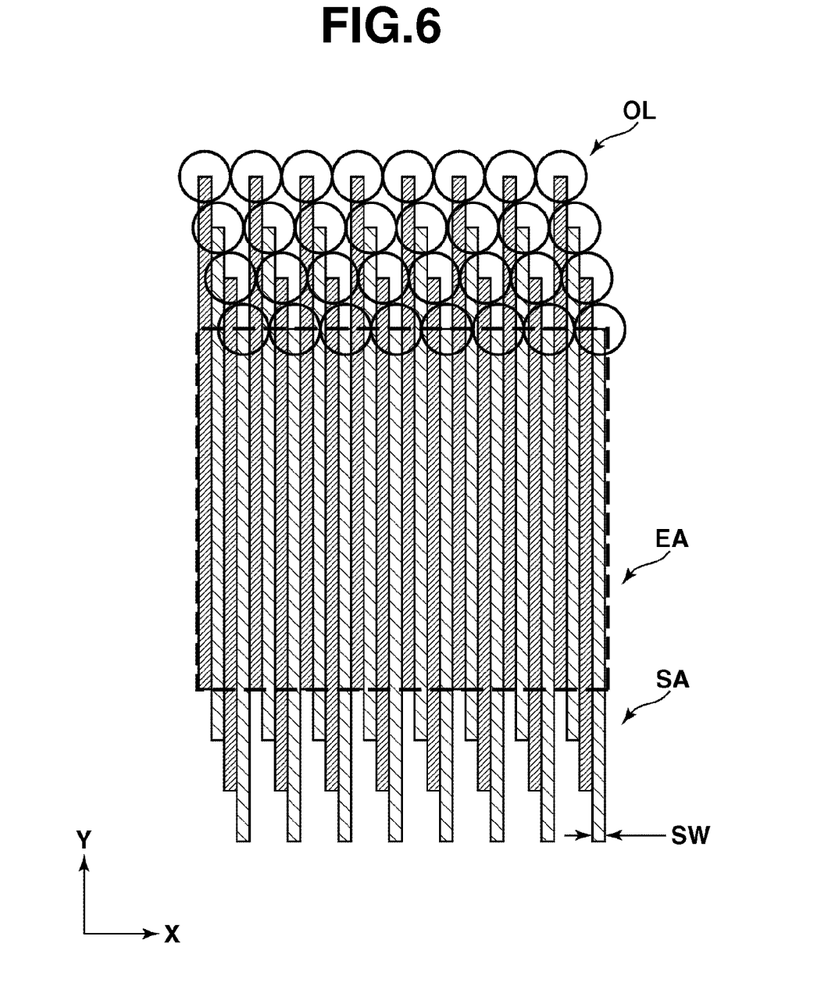
FIG. 6 is a view describing a positional relationship among a plurality of stripe drawing areas SA.

FIG. 6 is a view describing a positional relationship among a plurality of stripe drawing areas SA per every sub array (or objective lens). In the objective lens array 9, the objective lenses are one-dimensionally arranged in the X direction with a pitch of 130 μm and objective lenses in the next row are arranged to be shifted by 2 μm in the X direction so that the stripe drawing areas SA are adjacent to each other. In FIG. 6, for ease of description, four rows and eight columns objective lens arrays are illustrated. However, actually, for example, 65 rows and 200 columns objective lens arrays may be used (total 13,000 objective lenses are included). According to this configuration, drawing may be performed on an exposure area EA (a length in X direction of 26 mm) on the wafer 10 by continuously moving (scanning) the stage 11 in one direction along the Y direction. In other words, a general shot area (26 mm×33 mm) may be drawn by collective scanning (continuous scanning of the stage 11 in one direction along the Y direction)

Figure 7:
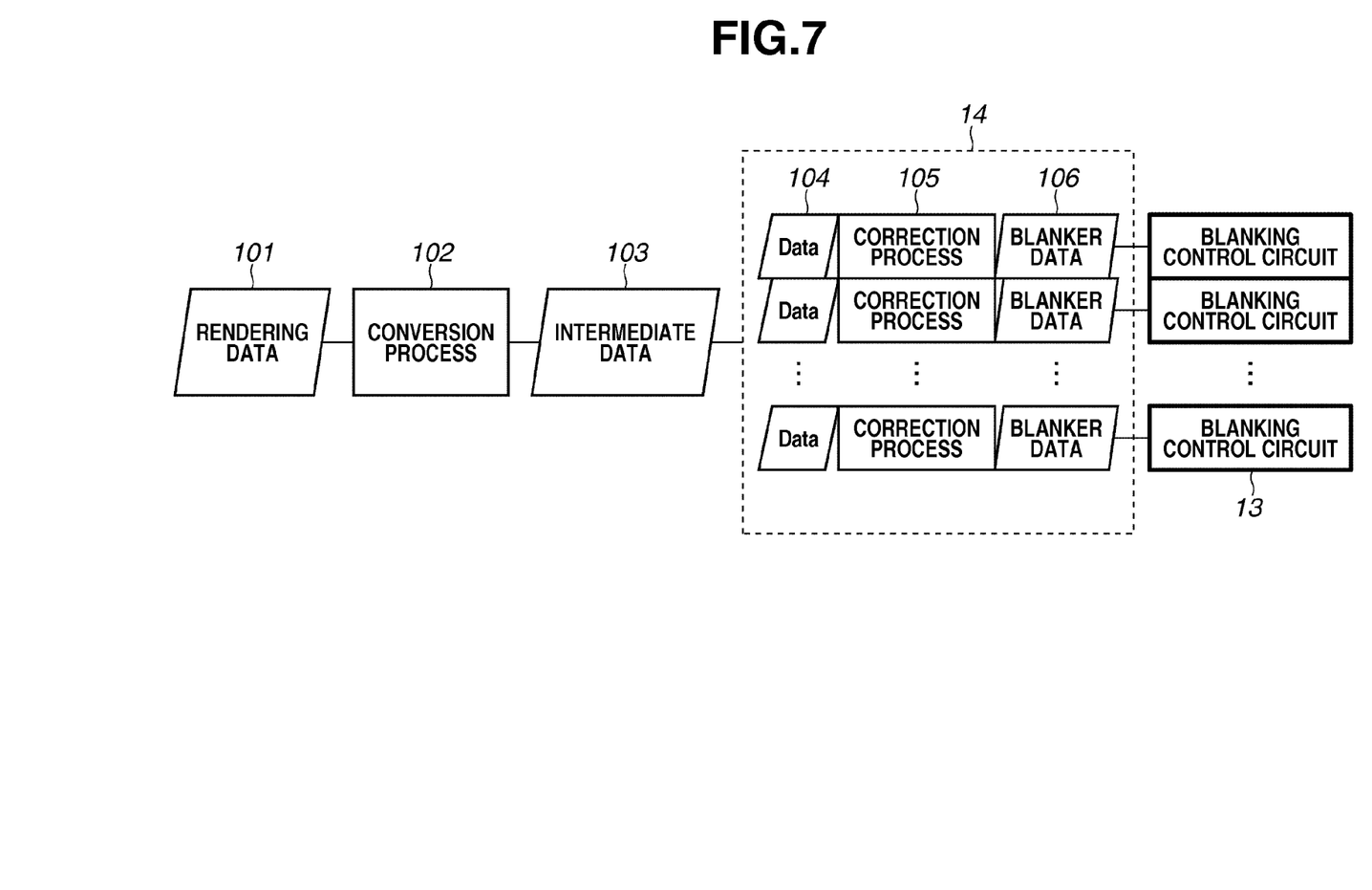
FIG. 7 is a view describing a data flow according to an exemplary embodiment.

FIG. 7 is a view illustrating a data flow according to the exemplary embodiment. In FIG. 7, the drawing data 101 is data to be drawn in the shot (for example, an area of maximum 26 mm×33 mm) and is vector type data stored in the drawing data memory 18. A conversion process 102 is performed by the intermediate data generating calculator 19 and may include the following (1) to (3) processes.

(1) A proximity effect correction is performed on the drawing data. A gradation of the drawing data may be changed by this correction. Further, a latent image which is formed on a resist may be different from a target latent image by the scattering of the electron beam which is incident onto the wafer. Here, the proximity effect correction refers to a process which is performed on the drawing data so that a latent image formed on the resist as a result of the scattering of the electron beam becomes the target latent image. The correction may be performed, for example, by processing the drawing data using a filter such as a Wiener filter formed based on the scattering.

(2) The drawing data on which the proximity effect correction is performed is divided into data in the unit of stripe (stripe data) defined by the drawing apparatus. In the (drawing) stripe data of the exemplary embodiment, a stripe width SW on the substrate is approximately 2 μm. However, if a stitching process that superimposes (multiple drawing) adjacent stripes is performed, data of 0.1 μm is added at both sides to generate stripe data in the unit of stripe whose stripe width SW is approximately 2.2 μm.

(3) Adjacent stripe data is added to the generated stripe data as much as a width which can be incorporated in each of the stripes by the distortion of the shot on the substrate to generate intermediate stripe data.

Figure 8A:
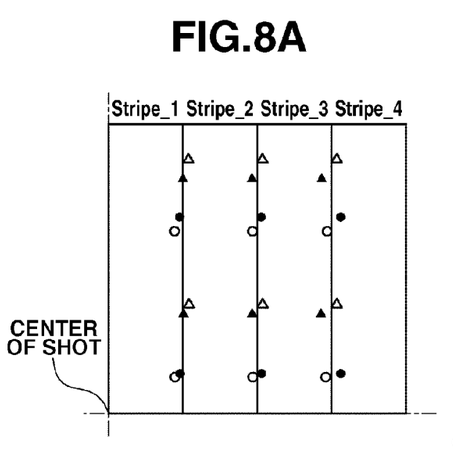
FIGS. 8A, 8B, and 8C are views describing drawing stripe data and intermediate stripe data.

The above process (3) which generates the intermediate stripe data will be described in detail with reference to FIGS. 8A, 8B, and 8C. FIG. 8A illustrates a part (a first quadrant when the drawing data is divided into first to fourth quadrants around a center of the shot) of the drawing data which is divided in the unit of stripe. A white circle indicates data located at a right end of each of the stripes and a white triangle indicates data located at a left end of each of the stripes. In the drawing apparatus which performs drawing in parallel using a plurality of electron beams, it is advantageous in the view of processing time when the plurality of stripe data corresponding to the plurality of electron beams is performed in parallel. However, in this case, it is necessary to note the following points.

Referring to FIG. 8A, if an expansion distortion occurs on the shot on the substrate, data indicated by the white circle needs to be drawn in the position of the black circle. In other words, stripe data including the black circle requires data of the white circle. In contrast, if a contraction distortion occurs on the shot on the substrate, data of a white triangle needs to be drawn in the position of a black triangle. In other words, stripe data including the black triangle requires data of the white triangle.

Figure 8B:
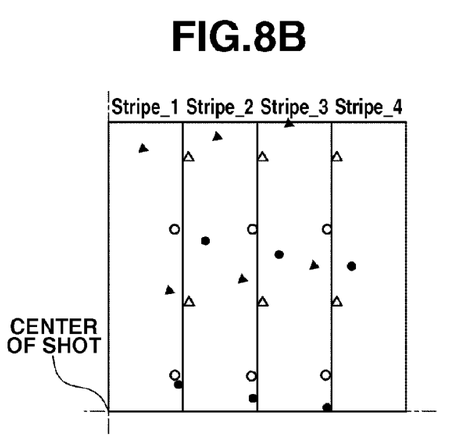
Figure 8C:
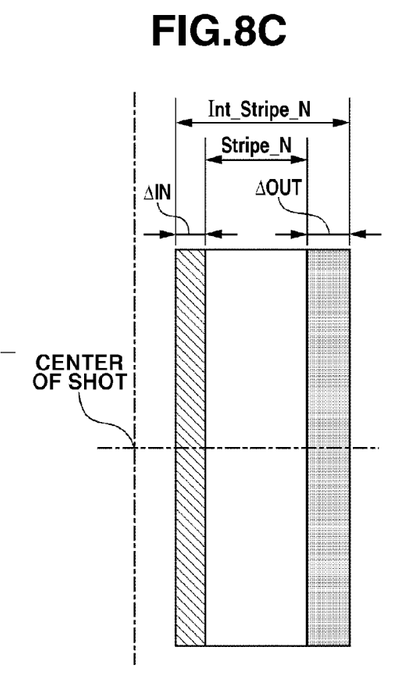

Further, FIG. 8B illustrates a case where a rotation distortion occurs on the shot on the substrate. If a right rotation distortion occurs on the shot on the substrate, data of a white circle needs to be drawn in the position of the black circle. In other words, stripe data including the black circle requires data of the white circle. In contrast, if a left rotation distortion occurs on the shot on the substrate, data of the white triangle needs to be drawn in the position of the black triangle. In other words, stripe data including the black triangle requires data of the white triangle.

Therefore, if a distortion occurs on the shot on the substrate, the intermediate stripe data for each of the electron beams as described above needs to be generated. FIG. 8C illustrates the intermediate stripe data having a stripe width Int_Stripe_N. The intermediate stripe data is generated by adding adjacent stripe data to the stripe data having a stripe width Stripe_N generated in the above process (2) in such a manner that a width ΔIN is added to an edge of the shot center-leaning and a width ΔOUT is added to an opposite edge. As described above, the plurality of intermediate stripe data is generate so that the intermediate data includes the data overlapping with adjacent stripe data.

Here, widths of ΔIN and ΔOUT will be described. A maximum value of an absolute value of an expansion and contraction (magnification ratio) error coefficient of the shot on the substrate is set as βmax and a maximum value of an absolute value of a rotation error coefficient is set as θmax. These values are, for example, input to the controller 100 through the input/output unit 200 (input unit and output unit) of FIG. 1, and for example, may be stored to be rewritable in a memory in the intermediate data generating calculator. It is assumed that a coordinate (X,Y) of the center of the shot is (0, 0), a length of the shot in the Y direction is 2×Sy, an absolute value of the X coordinate of the edge of the original stripe of the shot center-leaning is Xin, and an absolute value of the X coordinate of the opposite edge is Xout. In this case, the widths of ΔIN and ΔOUT may be set as the following Equations (5) and (6).

$$\Delta IN = \beta max \times Xin + (1 + \beta max) \times \theta max \times Sy \quad (5)$$

$$\Delta OUT = \beta max \times Xout + (1 + \beta max) \times \theta max \times Sy \quad (6)$$

Further, if the stripe width is sufficiently small as compared with the shot width, ΔIN and ΔOUT may be as follows.

$$\Delta IN = \Delta OUT = \beta max \times Xout + (1 + \beta max) \times \theta max \times Sy \quad (7)$$

In addition, if the memory capacity has a margin, the length of the shot in the X direction is 2×Sx and ΔIN and ΔOUT may be as follows.

$$\Delta IN = \Delta OUT = \beta max \times Sx + (1 + \beta max) \times \theta max \times Sy \quad (8)$$

In this case, if βmax=10 [ppm], θmax=0.3 [ppm], Sx=13 [mm], and Sy=16.5 [mm], ΔIN=ΔOUT=135.0 [nm].

Referring to FIG. 7 again, the intermediate data 103 is a set of the intermediate stripe data generated as described above and stored in the intermediate data memory 20. Up to here, a preliminary data flow which is performed on the drawing data 101 has been described.

Continuously, referring to FIG. 7, data flow after the wafer 10 is inserted in the drawing apparatus will be described. First, the main controller 21 sends the intermediate stripe data from the intermediate data memory 20 to the data processing circuit 14. The data processing circuit 14 stores the sent intermediate stripe data in DATA which is provided in the unit of stripe. In parallel thereto, the mark detector 12 detects the alignment mark which is attached to the shot formed on the wafer 10 and the position detecting circuit 16 calculates a distortion (expansion and contraction error coefficient βr, rotational error coefficient θr) of the shot based on an output of the mark detector 12. The data processing circuit 14 obtains information on the distortion of the shot calculated by the position detecting circuit 16 through the main controller 21.

The data processing circuit 14 performs the correction process 105 including the following processes <1> to <4> on the DATA (intermediate stripe data) in the unit of stripe.

<1> A geometric conversion represented by the following conversion Equation (9) is performed.

$$\begin{pmatrix} x' \\ y' \end{pmatrix} = \begin{pmatrix} Ox \\ Oy \end{pmatrix} + \begin{pmatrix} 1+\beta r & 0 \\ 0 & 1+\beta r \end{pmatrix} \begin{pmatrix} 1 & -\theta r \\ \theta r & 1 \end{pmatrix} \begin{pmatrix} x \\ y \end{pmatrix} \quad (9)$$

where x and y are coordinate before correction, x' and y' are coordinate after correction, and Ox and Oy are offsets for compensating a positional error of the electron beam corresponding to the stripe.

<2> The intermediate stripe data which is converted by the conversion equation is trimmed to match with a width of the stripe drawing area.

<3> The data (vector type) after being trimmed is converted into bitmap data.

<4> The bitmap data for every electron beam is sorted in the order of being transmitted to the blanker to be converted into serial data and the blanker data 106 is obtained.

The blanker data 106 which is generated by the correction process 105 is sequentially sent to the blanking control circuit 13 and then converted into a control signal for the blanker array 6 by the blanking control circuit. The control signal is supplied to the blanker array 6 through an optical fiber for optical communication (not illustrated). According to the exemplary embodiment, it is possible to provide a drawing apparatus which has an advantage to generate the drawing stripe data in terms of satisfaction of both a superimposition precision for a shot having a distortion and a throughput. Further, if a throughput of the drawing apparatus has a margin, the intermediate stripe data may be generated based on information on the distortion of the shot obtained by the position detecting circuit 16.

A second exemplary embodiment will be described. In the exemplary embodiment, a distortion of shots of a plurality of wafers on which the same process is performed has been measured in advance. From an expansion and contraction rate error $\beta$ and a rotation error $\theta$ of the shot of each of the wafers which is measured in advance, an average value $\beta m$ of the expansion and contraction rate error and a variation of the expansion and contraction rate error (for example, three times of a standard deviation $\sigma$ or a difference between a maximum value and a minimum value) $\beta\sigma$, an average value $\theta m$ of the rotation error, and a variation $\theta\sigma$ of the rotation error are calculated. These values may be input to the controller 100 through the input/output unit 200.

In the first exemplary embodiment, the drawing data on which the proximity effect correction is performed is divided into data in the unit of stripe defined by the drawing apparatus. To the contrary, in the exemplary embodiment, before dividing the drawing data, the distortion compensation (the geometric conversion described above) is performed on the data after proximity effect correction based on the average value $\beta m$ of the expansion and contraction rate error and the average value $\theta m$ of the rotation error. Thereafter, the distortion compensated data is divided into data in the unit of stripe defined by the drawing apparatus. Thereafter, to generate the intermediate stripe data, in Equations (5) to (8), the widths $\Delta IN$ and $\Delta OUT$ may be set using $\beta max=\beta\sigma$ and $\theta max=\theta\sigma$. Usually, since $\beta max>\beta\sigma$ and $\theta max>\theta\sigma$, a storage capacity of the intermediate data may be reduced and a load for subsequent processes may be lowered.

Further, as a modification embodiment, the stripe width of the intermediate data in the first exemplary embodiment may be adjusted based on the average value $\beta m$ of the expansion and contraction rate error, the variation $\beta\sigma$ of the expansion and contraction rate error, the average value $\theta m$ of the rotation error, and the variation $\theta\sigma$ of the rotation error.

A third exemplary embodiment will be described. In the first exemplary embodiment, the drawing data on which the proximity effect correction is performed is divided into data in the unit of stripe defined by the drawing apparatus. Instead, in the exemplary embodiment, the proximity effect correction is performed in parallel in the unit of stripe in the correction process 105 of FIG. 7. In other words, the controller 100 may be configured to perform the proximity effect correction in the process of generating a plurality of drawing stripe data from a plurality of intermediate stripe data.

Figure 9:
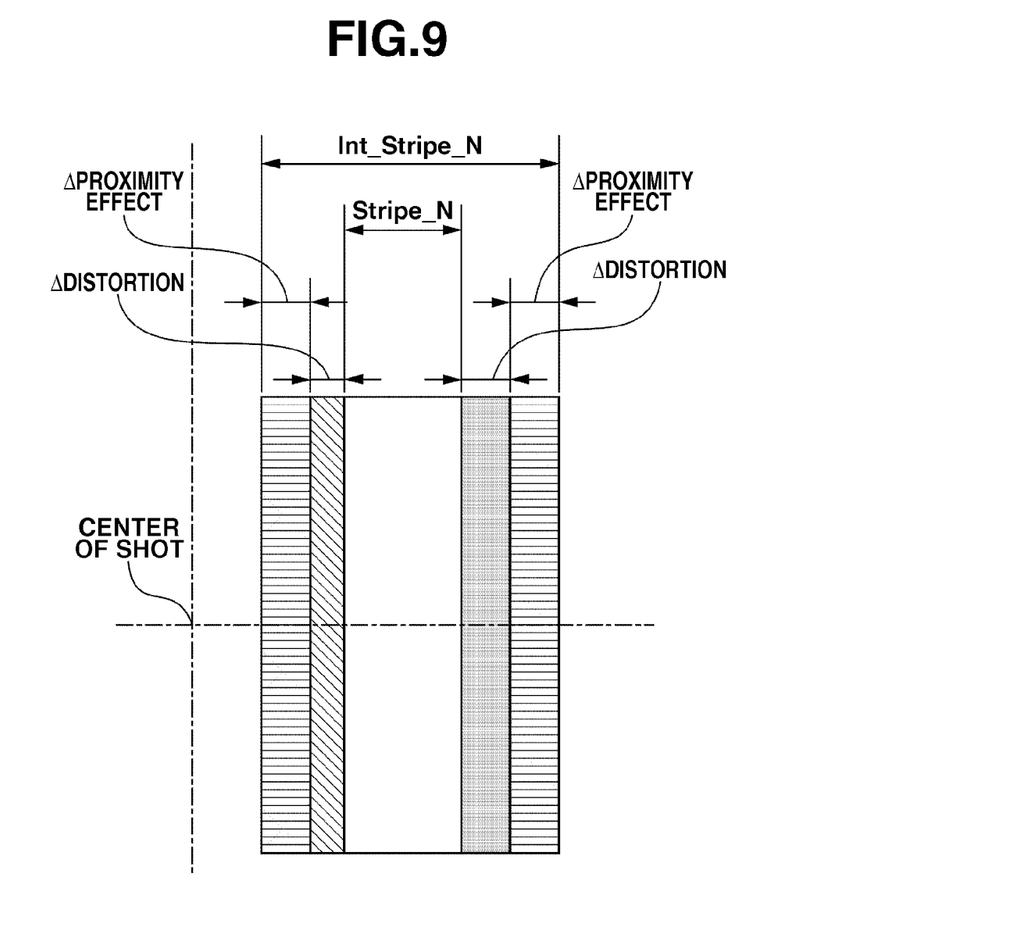
FIG. 9 is a view describing intermediate stripe data according to a third exemplary embodiment.

In order to perform the proximity effect correction, drawing data having an area which is larger than expansion of backscattering of the electron beam is required. Therefore, in the exemplary embodiment, to perform the proximity effect correction in the correction process 105, as illustrated in FIG. 9, adjacent stripe data is added to the intermediate stripe data of the first exemplary embodiment as much as the area which is larger than the expansion of the backscattering. As a result, the proximity effect correction process of the exemplary embodiment is performed in parallel in the unit of stripe which is different from the first exemplary embodiment in which the proximity effect correction process is collectively performed on entire drawing data, so that the proximity effect correction process can be performed in real time. Further, the processing order of the proximity effect correction and the distortion compensation may be changed. In addition, a width of the data which will be added from the adjacent stripe data to perform the proximity effect correction may be determined based on information on the proximity effect correction input from the input/output unit 200. The information may include, for example, information on expansion of the backscattering or a size of a filter for the proximity effect correction.

A fourth exemplary embodiment will be described. A method of manufacturing an article according to the exemplary embodiment is suitable for manufacturing an article such as a micro device including a semiconductor device or an element having a fine structure. The above manufacturing method may include a process for forming a latent image pattern using the drawing apparatus described above on a photosensitive material which is applied on a substrate (a process for performing drawing on the substrate) and a process for developing the substrate on which the latent image pattern is formed in the corresponding process. Further, the above manufacturing method may include other known process (oxidization, film formation, deposition, doping, planarization, etching, resist peeling, dicing, bonding, and packing). The method of manufacturing an article according to the exemplary embodiment is advantageous in terms of at least one of a performance, a quality, a productivity, and a manufacturing cost of the article compared to the method according to the related art.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2012-085724 filed Apr. 4, 2012, which is hereby incorporated by reference herein in its entirety.

What is claimed is:

1. A drawing method of performing drawing overlaid with a shot formed on a substrate with a plurality of charged particle beams based on a plurality of drawing stripe data that constitute drawing data, the drawing method comprising:
generating a plurality of intermediate stripe data as data of a plurality of intermediate stripes, adjacent ones of the plurality of intermediate stripes overlapping with each other;
obtaining information on distortion of the shot; and
transforming the plurality of intermediate stripe data based on the information on the distortion to generate the plurality of drawing stripe data.

2. The drawing method according to claim 1, wherein the information on the distortion includes information on a coefficient for representing the distortion.

3. The drawing method according to claim 1, wherein the information on the distortion includes information on an average value and a variation of a coefficient for representing the distortion, and wherein the drawing data is transformed based on the average value, and then the plurality of intermediate stripe data are generated so that the adjacent ones of the plurality intermediate stripes overlap with each other by a width set based on the variation.

4. A method of manufacturing an article, the method comprising:
- performing drawing on a substrate using a drawing method;
- developing the substrate on which the drawing has been performed; and
- processing the developed substrate to manufacture the article, wherein the drawing method performs drawing overlaid with a shot formed on a substrate with a plurality of charged particle beams based on a plurality of drawing stripe data that constitute drawing data, the drawing method comprising:
- generating a plurality of intermediate stripe data as data of a plurality of intermediate stripes, adjacent ones of the plurality of intermediate stripes overlapping with each other;
- obtaining information on distortion of the shot; and
- transforming the plurality of intermediate stripe data based on the information on the distortion to generate the plurality of drawing stripe data.

* * * * *